United States Patent
Kim

(10) Patent No.: US 7,206,237 B2
(45) Date of Patent: Apr. 17, 2007

(54) APPARATUS AND METHOD FOR TESTING A MEMORY DEVICE WITH MULTIPLE ADDRESS GENERATORS

(75) Inventor: Byoung-Sul Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 51 days.

(21) Appl. No.: 11/118,223

(22) Filed: Apr. 28, 2005

(65) Prior Publication Data

US 2005/0259485 A1 Nov. 24, 2005

(30) Foreign Application Priority Data

May 22, 2004 (KR) .................. 10-2004-0036627

(51) Int. Cl.
G11C 7/00 (2006.01)
(52) U.S. Cl. .............. 365/201; 365/200; 365/230.08; 714/718; 714/730
(58) Field of Classification Search .......... 365/201, 365/200, 230.08; 714/718, 730
See application file for complete search history.

(56) References Cited

U.S. PATENT DOCUMENTS 5,588,115 A 12/1996 Augarten

| | | | |
|---|---|---|---|
| 6,504,773 B2 * | 1/2003 | Kobayashi | ................... 365/201 |
| 6,523,143 B1 * | 2/2003 | Kobayashi | ................... 714/718 |
| 2004/0145933 A1 * | 7/2004 | Yamane | ....................... 365/45 |

FOREIGN PATENT DOCUMENTS

| | | |
|---|---|---|
| JP | 5-80125 | 4/1993 |
| JP | 08-146098 | 6/1996 |
| KR | 1996-0019322 | 6/1996 |
| KR | 1998-024686 | 7/1998 |

OTHER PUBLICATIONS

English language abstract of Korean Publication No. 1998-024686.
English language abstract of Korean Publication No. 1996-0019322.
English language abstract of Japanese Publication No. 5-80125.
English language abstract of Japanese Publication No. 08-146098.

* cited by examiner

*Primary Examiner*—Van Thu Nguyen
(74) *Attorney, Agent, or Firm*—Marger Johnson & McCollom, P.C.

(57) ABSTRACT

An apparatus includes a test signal path to provide a test signal to a memory cell array responsive to an address generating command, the test signal to access a memory cell within the memory cell array, a failure address path to generate a failure address responsive to the address generating command, and a failure discriminator to determine a result responsive to the access, the result to indicate whether the memory cell is faulty, and to store the result according to the failure address.

16 Claims, 6 Drawing Sheets

APPARATUS AND METHOD FOR TESTING A MEMORY DEVICE WITH MULTIPLE ADDRESS GENERATORS

REFERENCE TO RELATED APPLICATIONS

This application claims priority from Korean Patent Application No. 2004-36627 filed on May 22, 2004, which we incorporate by reference.

BACKGROUND OF THE INVENTION

1. Field of the Invention

The present invention relates to an apparatus and a method for testing a memory device.

2. Description of the Related Art

A typical memory device includes a plurality of memory cells, each memory cell to store data. To access the data stored in a memory cell, the memory device receives an address of the memory cell, and provides the stored data corresponding to the address after a time delay, or latency. The duration of the latency may be controlled by a mode register set (MRS).

An electric die sorting (EDS) process may be used to test memory cells of the memory device. When a faulty cell is found during the EDS process, a redundancy algorithm is applied to the memory device so that the faulty cell is replaced with a redundancy cell. The redundancy algorithm is capable of recognizing the address of the faulty cell and replacing the memory cell located at the address with the redundancy cell. Faulty cells are typically replaced by cutting or maintaining a fuse. To correctly test faulty cells during the EDS process the address of the faulty cell should be correctly recognized.

FIG. 1 is a block diagram illustrating a conventional memory test device. Referring to FIG. 1, the memory test device includes an address generator 100, a data generator 110, a timing generator 122, and a failure discriminator 120. The address generator 100 receives an address generating command from a pattern generator (not shown). The address generator 100 includes a register 102, an Arithmetic and Logic Unit/Multiplexer (ALU/MUX) 104 and an address counter 106 to generate an address of a memory cell to be tested. The address counter 106 provides the address to the data generator 110.

The data generator 110 generates data to be written to the memory device under test (DUT) 124 according to the address and provides the data and address to an address/data bus 115. The data generator 110 includes a memory data generator 112 and an address scrambler 114. The memory data generator 112 generates the data to be written into the DUT 124. The address scrambler 114 may be used in some testing modes to replace the address with another address (not shown) provided external to the memory test device, and the address or the replaced address to the address/data bus 115.

Timing generator 122 receives the address and optionally the data from the data generator 110, and operation commands for controlling the operation of the DUT 124, over the address/data bus 115. The timing generator 122 provides the address and command(s) to the DUT 124, causing the DUT 124 to provide data stored in a memory cell corresponding to the address to the failure discriminator 120.

The failure discriminator 120 compares the data from the DUT 124 with an expected value and stores a comparison result for failure analysis and the redundancy algorithm. The comparison result indicates whether a memory cell of the DUT 124 is faulty. The failure discriminator 120 includes a comparator 126 and a failure memory 128.

The comparator 126 receives and compares the data from the DUT 124 and the expected value, and stores the result of the comparison in the failure memory 128 according to the address from the data generator 110 carried on the address/data bus 115. However, since the retrieval of stored data from the DUT 124 has a delay, in a high-speed test operation, the address provided to the failure memory 128 may not be the same address used to access the DUT 124. Consequentially, a faulty memory cell may be undetected, and a correctly operating memory cell may be mistakenly replaced.

FIG. 2 is a timing diagram illustrating operation of the conventional memory test device shown in FIG. 1. Referring to FIG. 2, a memory command is generated in response to an input clock signal having a predetermined frequency. A row active command ACT is detected at a rising edge of the input clock, and activates a word line of a memory cell array of the DUT 124. When the row active command ACT is detected, an address applied to the DUT 124 is identified as a row address, and a word line corresponding to the identified row address is activated. When a read command RD is detected at the rising edge of the input clock, a corresponding bit line of the DUT 124 is electrically connected to a local data line, allowing the data stored on the bit line to pass through internal functioning blocks (not shown) of the DUT 124. In other words, when a row address and a column address are provided to the DUT 124, the data stored in the memory cell corresponding intersection of the row and column addresses are provided to the failure discriminator 120 after predetermined number of clock cycles, or latency.

At internal clock periods CK5 and CK6, data stored in a memory cell corresponding to a row address X1 and a column address Y1 is provided to failure discriminator 120, where the failure discriminator 120 compares the stored data to the expected result and stores the result of the comparison to the failure memory 128 at a row address X3 and a column address Y3. Therefore, due to the latency of the DUT 124 the test result is stored at failure memory addresses X3 and Y3 instead of the failure addresses X1 and Y1.

FIG. 3 is a diagram showing the addressing of a failure memory and a memory device under test shown in FIG. 1. Referring to FIG. 3, data D1, D2, D3, and D4 stored in the DUT 124 is provided to the comparator 126 and compared with an expected value. When data D1 corresponding to the cell address X1 and Y1 is compared with the expected value, a test result T1, i.e., a result of the comparison, should be stored in the failure address X1 and Y1. Due to the latency of the DUT 124, however, the test result T1 is erroneously stored in a failure address X3 and Y3. When data D2 corresponding to the memory address X2 and Y2 is compared with an expected value and a test result T2 is stored in a failure address X4 and Y4. Similarly, when data D3 and D4 are read and compared with corresponding expected values, both of test results T3 and T4 are stored in the failure address X4 and Y4. The test result T2 stored in the failure memory 128, therefore, may be erased when the test result T3 is stored, and test result T3 may be erased when T4 is stored. This errant storage of test results may cause the redundancy algorithm to perform improperly.

One solution to overcome this problem is to delay accessing the DUT 124 the latency period. This solution, however, requires an additional testing time. A separate addressing approach is disclosed in Korea Patent No. 0199217, where an address generated from an address generator is divided into an address to a test memory and an address to a failure memory. This approach, however, however, does not allow independent addressing of a memory device under test and to a failure memory, and thus the may erroneously store failure test results.

SUMMARY OF THE INVENTION

The present invention provides an apparatus for testing a memory device comprising a test signal path to provide a test signal to a memory cell array responsive to an address generating command, the test signal to access a memory cell within the memory cell array, a failure address path to generate a failure address responsive to the address generating command, and a failure discriminator to determine a result responsive to the access, the result to indicate whether the memory cell is faulty, and to store the result according to the failure address.

BRIEF DESCRIPTION OF THE DRAWINGS

The features and advantages of the present invention will become more apparent a detailed description of the exemplary embodiments referencing the attached drawings.

DETAILED DESCRIPTION OF THE INVENTION

Figure 1:
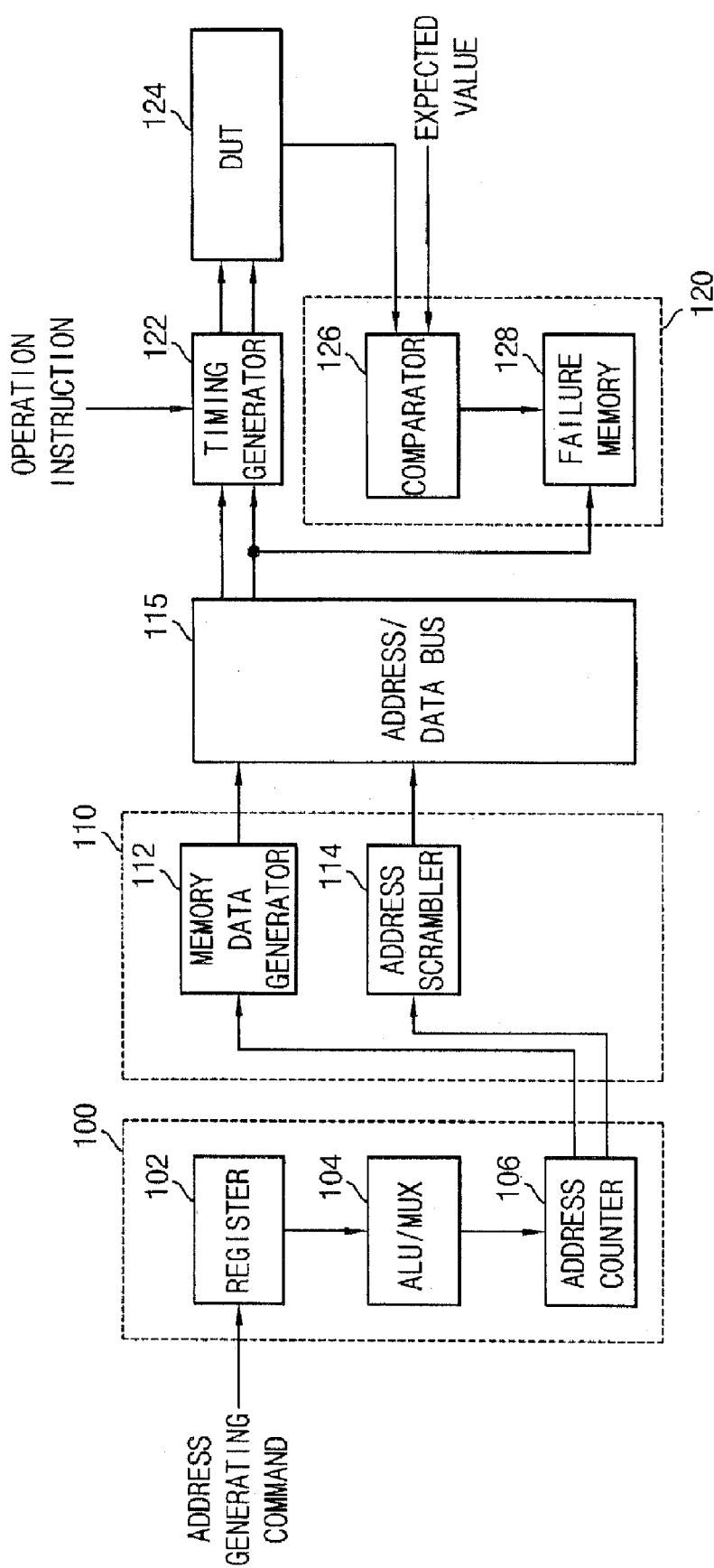
FIG. 1 is a block diagram illustrating a conventional memory test device.
Figure 2:
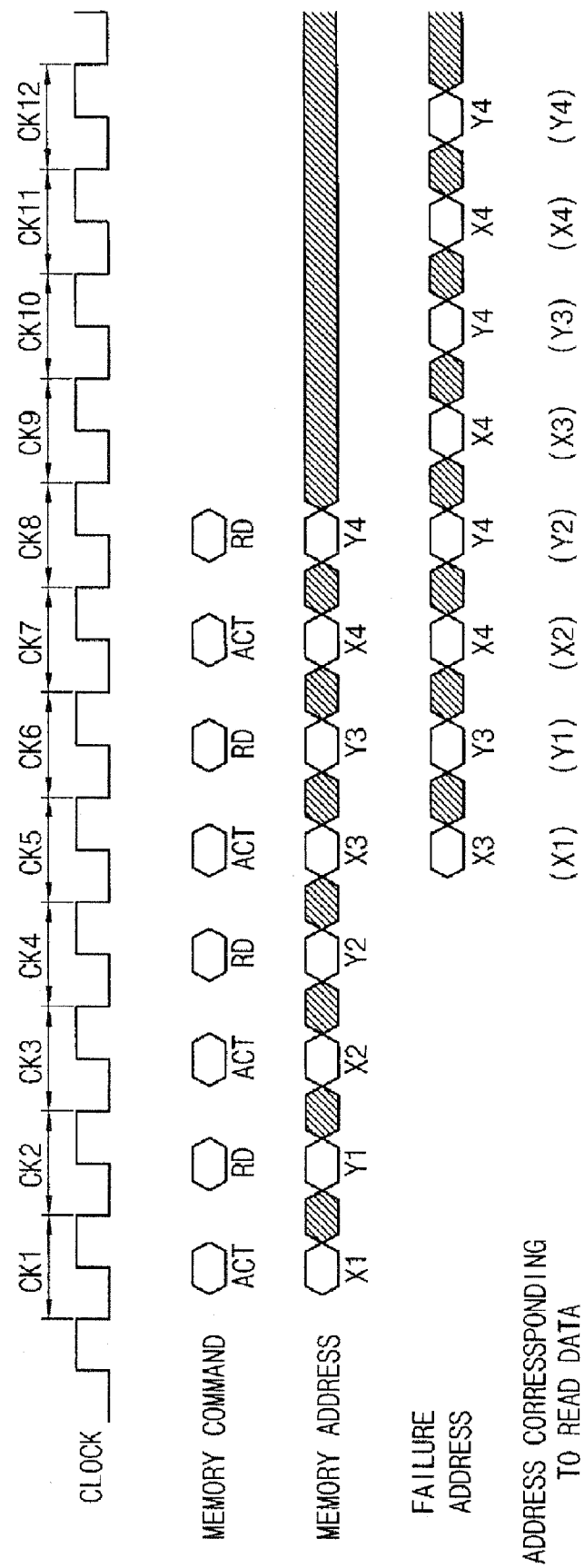
FIG. 2 is a timing diagram illustrating operation of the conventional memory test device shown in FIG. 1.
Figure 3:
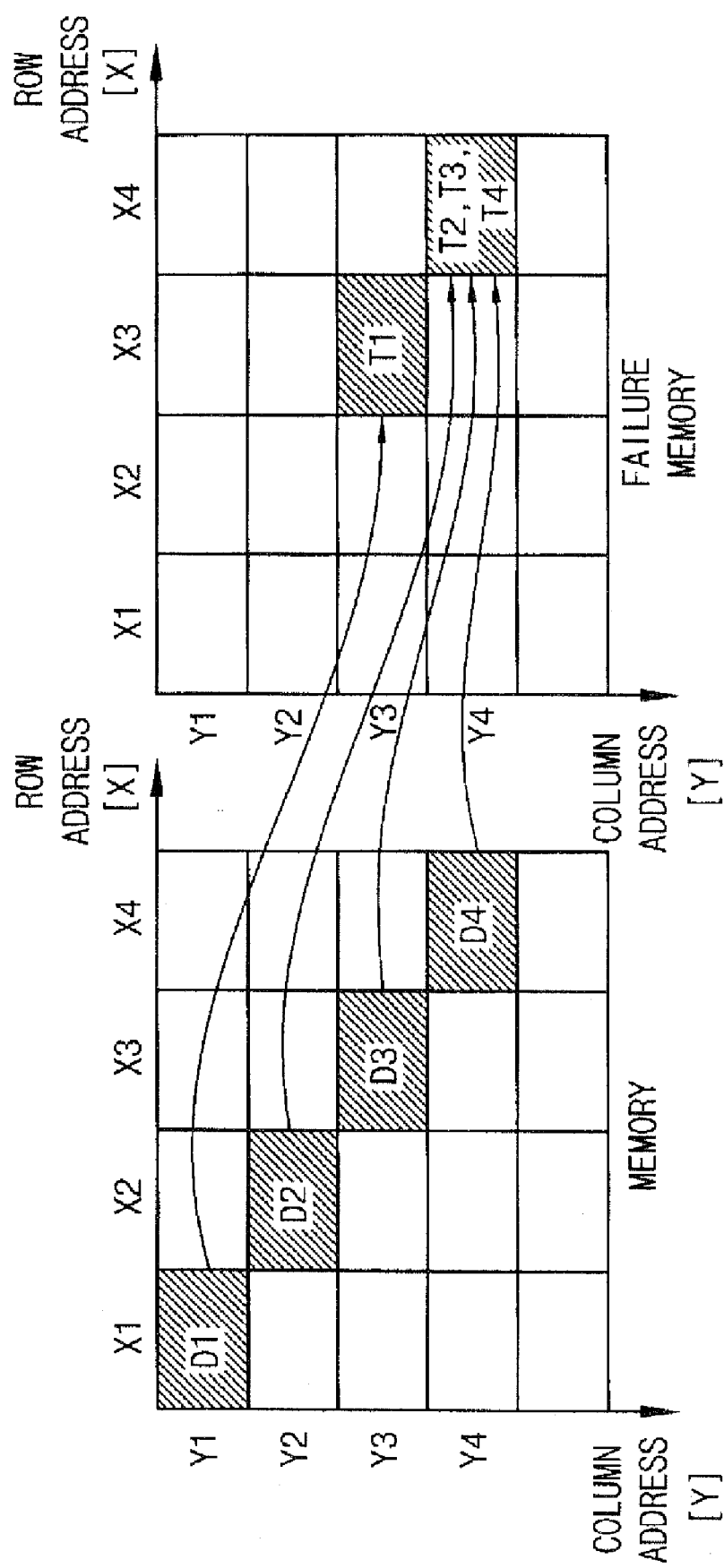
FIG. 3 is a diagram showing the addressing of a failure memory and a memory device shown in FIG. 1.
Figure 4:
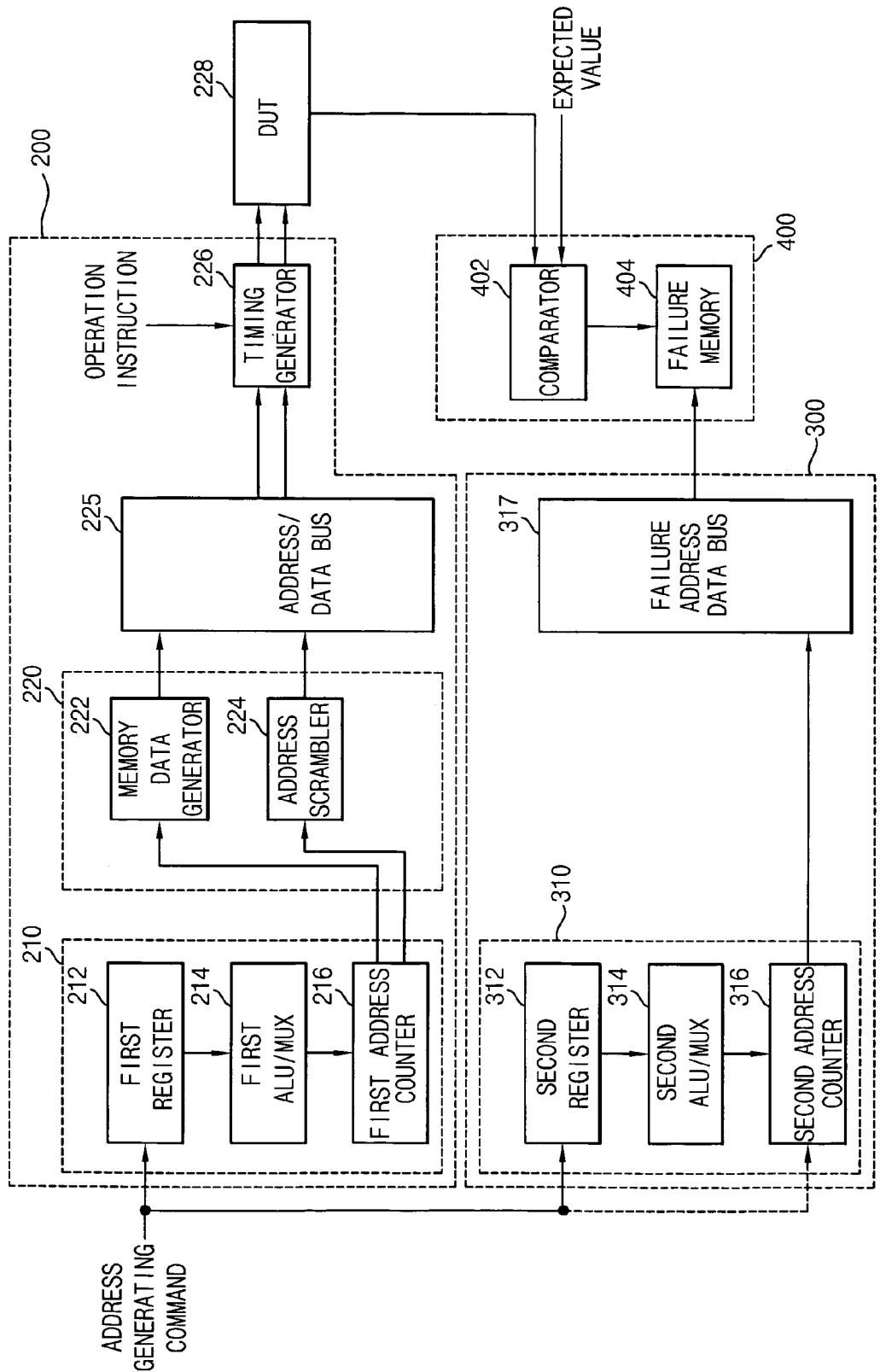
FIG. 4 is a block diagram illustrating a memory test device according to an embodiment of the present invention.

FIG. 4 is a block diagram illustrating a memory test device according to an embodiment of the present invention. Referring to FIG. 4, the memory test device includes a test signal path 200, a failure address path 300 and a failure discriminator 400. The test signal path 200 provides a test signal to a memory device under test (DUT) 228. The DUT 228 may be a memory cell array including a plurality of memory cells, where each memory cell is accessed with a corresponding address. The test signal includes a command(s) for controlling the DUT 228 and an address corresponding to a memory cell within the DUT 228.

The test signal path 200 includes an address generator 210, a data generator 220 and a timing generator 226. The address generator 210 generates an address corresponding to a memory cell within the DUT 228. The address generator 210 includes a first register 212, a first ALU/MUX 214 and a first address counter 216. The first register 212 receives an address generating command and transfers the command to the first ALU/MUX 214 and the first address counter 216 for processing. The first address counter 216 provides the address to data generator 220. Alternatively, the address generating command may be directly applied to the first address counter 216, where the command is provided to the data generator 220 as the address.

The data generator 220 provides an address corresponding to a memory cell to the DUT 228. In a write operational mode, the data generator 220 may generate data responsive to the address from the address generator 210 and provide the data to the DUT 228. In other words, the data is generated and provided to the DUT 228 during a write operation of the DUT 228. The data generator 220 may replace the address received from the address generator 210 with another address provided externally to the data generator 220. The data generator 220 includes a memory data generator 222 and optionally an address scrambler 224. The memory data generator 222 generates the data to be written to the memory cell addressed by the address received from the address generator 210. The address scrambler 224 may replace the addresses of the memory cell with an externally provided replacement addresses. The address scrambler 224 may provide the address, or the externally provided replacement address, to an address/data bus 225. Alternatively, the address generator 210 may directly provide an address to the address/data bus 225 without passing through the address scrambler 224. A timing generator 226 controls timing for a test operation responsive to the address, and the operation of the DUT 228 responsive to an operation command. The operation command is used to determine operations to be performed by the DUT 228, e.g., read, write, etc.

The data stored in a memory cell of the DUT 228 is provided to the failure discriminator 400 in response to the test signal from the test signal path 200. The failure discriminator 400 includes a comparator 402 to compare the data from the DUT 228 with an expected value, and to store the comparison result. The comparison result indicates whether the addressed memory cell is faulty. To determine and correct failures of the memory cells in the DUT 228 with a redundancy algorithm, the comparison result needs to be stored. Thus, the failure discriminator 400 includes a failure memory 404.

The failure address path 300 generates a failure address corresponding to a test result of the DUT 228 based on the address generating command. To generate the failure address, the failure address path 300 has a failure address generator 310. The failure address generator 310 generates the failure address responsive to the address generating command. The failure address corresponds to the address generated by the address generator 210. The failure address generator 310 includes a second register 312, a second ALU/MUX 314 and a second address counter 316 to generate the failure address during a read operation. The failure address generator 310 operates similarly to address generator 210. The failure address is provided to the failure memory 404 over a failure address/data bus 317.

Figure 5:
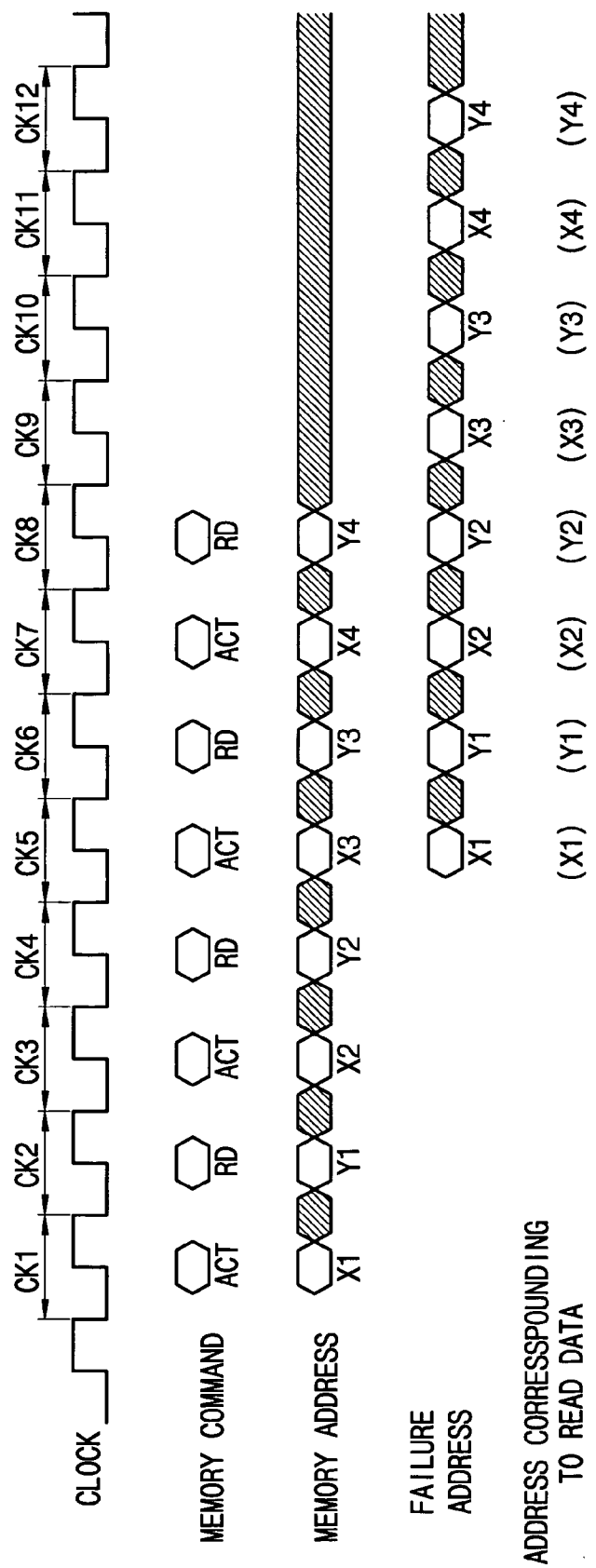
FIG. 5 is a timing diagram illustrating operation of a memory test device according to an embodiment of the present invention.

FIG. 5 is a timing diagram illustrating the operation of a memory test device according to an embodiment of the present invention. Referring to FIG. 5, memory commands are generated in response to a clock signal. A row active command ACT detected at a rising edge of the clock signal, activates a word line of the DUT 228. When the row active command ACT is detected, an address applied to the DUT 228 is recognized as a row address and a word line corresponding to the row address is activated. When a read command RD is detected at the rising edge of the clock signal, a corresponding bit line of the DUT 228 is electrically connected to a local data line, allowing the data stored on the bit line to pass through internal functioning blocks (not shown) of the DUT 228. In other words, when a row address and a column address are provided to the DUT 124, the data stored in the memory cell corresponding intersection of the row and column addresses are provided to the failure discriminator 120 after predetermined number of clock cycles, or latency.

At clock periods CK5 and CK6, data stored in a memory cell corresponding to a row address X1 and a column address Y1 is provided to failure discriminator 400, where the failure discriminator 400 compares the stored data to the expected result and stores the comparison result to the failure memory 404 at a row address X1 and a column address Y1 according to the failure address from the failure address generator 310. Additionally, at clock periods CK7 and CK8, data stored in a memory cell corresponding to a row address X2 and a column address Y2 of the DUT 228 is provided to failure discriminator 400, where the failure discriminator 400 compares the stored data to the expected result and stores the comparison result to the failure memory 404 at row address X2 and column address Y2 according to the failure address from the failure address generator 310. Likewise, data stored in a row address X3 and a column address Y3, and row address X4 and a column address Y4 of the DUT are independently compared and the results stored in a row address X3 and a column address Y3, and row address X4 and a column address Y4, of the failure memory 404, respectively.

The memory test device of the present invention has the failure address path 300, which is independent of the test signal path 200, thus allowing storage of test results at failure addresses independent of the testing address.

Figure 6:
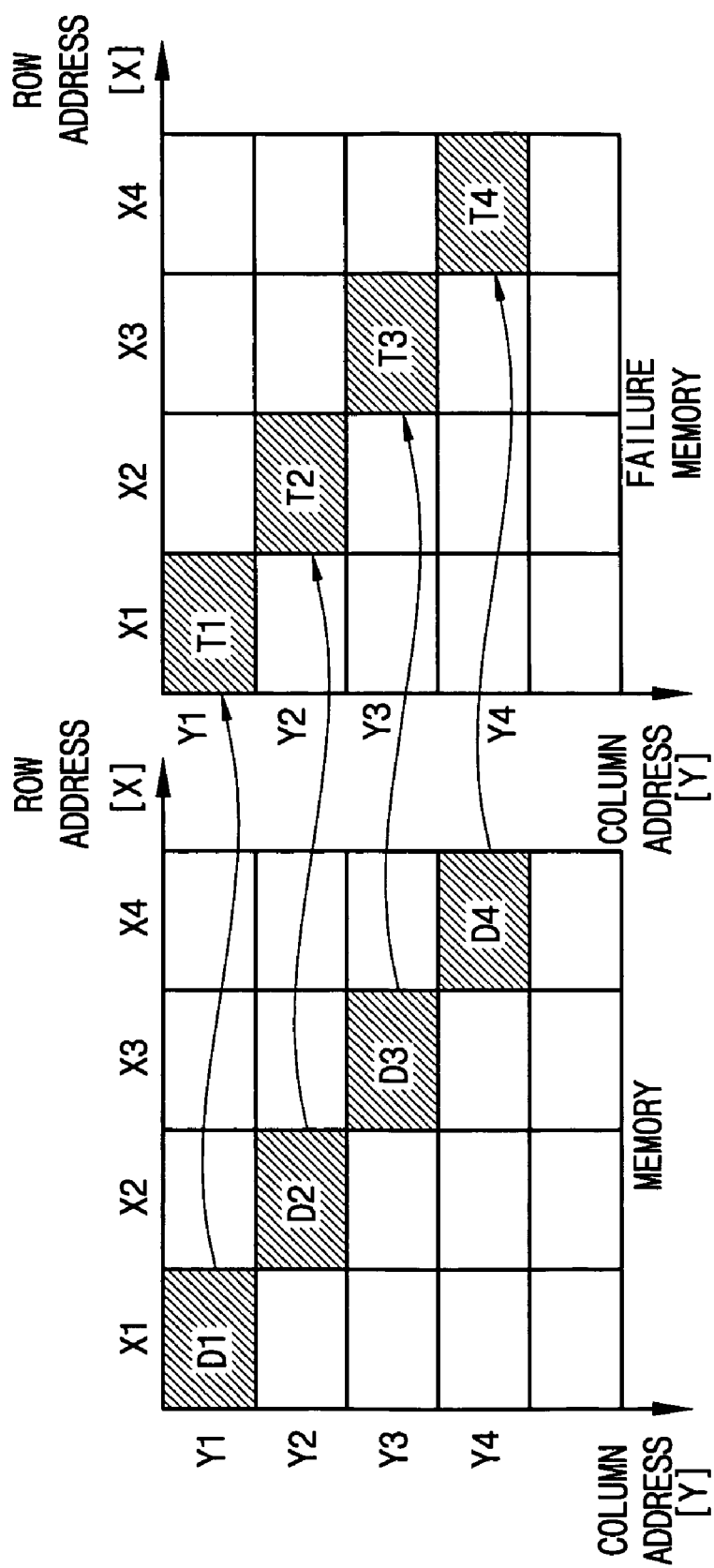
FIG. 6 is a diagram showing the addressing of a failure memory according to an embodiment of the present invention.

FIG. 6 is a diagram showing the addressing of a failure memory according to an embodiment of the invention. Referring to FIG. 6, data corresponding to a memory cell of the DUT 228 is compared with an expected value and the comparison result is stored in the failure memory 404 according to the failure address from the failure address generator 310. The failure address is provided to the failure memory 404 in consideration of the latency of the DUT 228.

Data D1 stored in a row address X1 and a column address Y1 of the DUT 228 is compared with a corresponding expected value by comparator 402, and the comparison result T1 is stored in a memory cell corresponding to the row address X1 and the column address Y1 of the failure memory 404. Data D2, D3, and D4 are similarly compared and the corresponding comparison results T2, T3, and T4, respectively, are stored in failure memory 404 at their appropriate failure addresses. The redundancy algorithm, therefore, correctly determine which memory cells are faulty responsive to there test result and their address in failure memory 404.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

I claim the following:

1. An apparatus comprising:
   a test signal generator to generate a test address corresponding to a memory cell in an array responsive to a command, the test signal generator to access the memory cell according to the test address;
   a failure address generator to generate a failure address independently to the generation of the test address and responsive to the command, the failure address corresponding to the same memory cell as the test address; and
   a failure discriminator to determine the memory cell is faulty responsive to the access of the memory cell, and to store an indication of the faulty memory cell according to the failure address from the failure address generator.

2. The apparatus of claim 1
   where the test signal is adapted to cause the memory cell to provide data to the failure discriminator; and
   where the failure discriminator is adapted to store a test result of the data in a failure memory responsive to the failure address.

3. The apparatus of claim 2
   where the failure discriminator includes a comparator to compare the data with an expected value.

4. The apparatus of claim 3
   where the test signal generator includes a test data generator to generate data responsive to the test address, and to store the data to the memory cell; and
   where the expected value corresponds to the generated data.

5. The apparatus of claim 1 where the failure discriminator includes a failure memory adapted to store a test result of the data responsive to the failure address.

6. The apparatus of claim 5
   where the test signal generator provides the test signal to the array over a test bus; and
   where the failure address generator provides the failure address to the failure memory over a failure bus.

7. The apparatus of claim 1 where the test signal generator includes an address generator to generate the test address responsive to the command.

8. The apparatus of claim 1 where the failure address generator includes a failure address generator to generate the failure address responsive to the command.

9. A method comprising:
   generating a test address responsive to a command;
   accessing a memory cell using the test address;
   generating a failure address independently to the test address and responsive to the command;
   determining a cell failure responsive to the accessing, the cell failure to indicate whether the memory cell is faulty; and
   storing the cell failure according to the failure address and responsive to the determining.

10. The method of claim 9 including
    causing the memory cell to provide data to a failure discriminator; and
    where determining the cell failure is based on the data.

11. The method of claim 9 where determining the cell failure responsive to the accessing includes comparing data provided from the memory cell with an expected value.

12. The method of claim 11 including storing the data to the memory cell when the expected value corresponds to the data.

13. The apparatus of claim 1 where the test signal generator includes an address scrambler to replace the test address with a replacement address corresponding to another memory cell in an array, the replacement address provided from a source external to the apparatus, where the address scrambler is configured to access the other memory cell according to the replacement test address.

14. The apparatus of claim 1 where the failure address generator is configured to provide the failure address to the failure discriminator according to a latency associated with the access of the memory cell with the test memory address.

15. The method of claim 9 includes
    replacing the test address with a replacement test address provided from a source external to the apparatus; and
    accessing another memory cell using the replacement test address.

16. The method of claim 9 includes providing the failure address to a failure discriminator according to a latency associated with the access of the memory cell with the test memory address.

* * * * *